(12) United States Patent
Katkar et al.

(10) Patent No.: US 10,515,913 B2
(45) Date of Patent: Dec. 24, 2019

(54) MULTI-METAL CONTACT STRUCTURE (71) Applicant: Invensas Bonding Technologies, Inc., San Jose, CA (US)

(72) Inventors: Rajesh Katkar, San Jose, CA (US); Cyprian Emeka Uzoh, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/919,894

(22) Filed: Mar. 13, 2018

(65) Prior Publication Data

US 2018/0269172 A1 Sep. 20, 2018

Related U.S. Application Data (60) Provisional application No. 62/472,877, filed on Mar. 17, 2017.

(51) Int. Cl.
*H01L 23/00* (2006.01)
(52) U.S. Cl.
CPC ............. *H01L 24/05* (2013.01); *H01L 24/03* (2013.01); *H01L 24/08* (2013.01); *H01L 24/80* (2013.01);
(Continued)
(58) Field of Classification Search
CPC ......... H01L 24/05; H01L 24/03; H01L 24/08; H01L 24/80; H01L 2224/03464; H01L 2224/03616; H01L 2224/05013; H01L 2224/05015; H01L 2224/05026; H01L 2224/05076; H01L 2224/05082; H01L 2224/05105; H01L 2224/05109; H01L 2224/05111; H01L 2224/05144; H01L 2224/05147; H01L 2224/05155; H01L 2224/05166; H01L 2224/05171; H01L 2224/05181; H01L 2224/08145; H01L 2224/80895
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

| JP | 2013-33786 | 2/2013 |
| JP | 2018-160519 A | 10/2018 |
| WO | 2005-043584 A2 | 5/2005 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

(Continued)

*Primary Examiner* — Didarul A Mazumder (57) ABSTRACT

A first conductive material having a first hardness is disposed within a recess or opening of a microelectronic component, in a first preselected pattern, and forms a first portion of an interconnect structure. A second conductive material having a second hardness different from the first hardness is disposed within the recess or opening in a second preselected pattern and forms a second portion of the interconnect structure.

15 Claims, 7 Drawing Sheets

(52) U.S. Cl.
CPC ............... *H01L 2224/03464* (2013.01); *H01L 2224/03616* (2013.01); *H01L 2224/05013* (2013.01); *H01L 2224/05015* (2013.01); *H01L 2224/05026* (2013.01); *H01L 2224/05076* (2013.01); *H01L 2224/05082* (2013.01); *H01L 2224/05105* (2013.01); *H01L 2224/05109* (2013.01); *H01L 2224/05111* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05181* (2013.01); *H01L 2224/08145* (2013.01); *H01L 2224/80895* (2013.01)

(58) Field of Classification Search
USPC .................................. 257/773; 438/618, 666
See application file for complete search history.

(56) References Cited

U.S. PATENT DOCUMENTS

| | | | |
|---|---|---|---|
| 6,080,640 A | 6/2000 | Gardner et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu et al. | |
| 8,809,123 B2 | 8/2014 | Liu et al. | |
| 9,142,517 B2 | 9/2015 | Liu et al. | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,026,605 B2 | 7/2018 | Doub et al. | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2005/0186778 A1 | 8/2005 | Canaperi et al. | |
| 2006/0057945 A1 | 3/2006 | Hsu et al. | |
| 2007/0111386 A1 | 5/2007 | Kim et al. | |
| 2008/0237053 A1* | 10/2008 | Andricacos | C25D 3/562 205/186 |
| 2009/0121355 A1* | 5/2009 | Haneda | H01L 21/2855 257/751 |
| 2010/0099251 A1* | 4/2010 | Fu | H01L 21/76814 438/653 |
| 2010/0295181 A1* | 11/2010 | Yang | H01L 21/76843 257/751 |
| 2011/0041329 A1 | 2/2011 | Tong et al. | |
| 2011/0049716 A1* | 3/2011 | Yang | C23C 16/0272 257/751 |
| 2013/0062775 A1 | 3/2013 | Ryan | |
| 2013/0127055 A1* | 5/2013 | Chen | H01L 23/53238 257/751 |
| 2014/0175655 A1 | 6/2014 | Chen et al. | |
| 2015/0064498 A1 | 3/2015 | Tong | |
| 2015/0092371 A1 | 4/2015 | Meinhold | |
| 2016/0137492 A1* | 5/2016 | Cheng | B81C 1/00238 257/415 |
| 2016/0343682 A1* | 11/2016 | Kawasaki | H01L 24/24 |
| 2017/0025381 A1 | 1/2017 | Tsai et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

OTHER PUBLICATIONS

International Search Report and Written Opinion, dated Jun. 29, 2018, for PCT Application No. PCT/US2018/022379, 26 pages.

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.

Plobi et al., "Wafer Direct Bonding: Tailoring Adhesion Between Brittle Materials," Materials Science and Engineering Review Journal, 1999, 88 pages.

* cited by examiner

MULTI-METAL CONTACT STRUCTURE

PRIORITY CLAIM AND CROSS-REFERENCE TO RELATED APPLICATION

This application claims the benefit under 35 U.S.C. § 119(e)(1) of U.S. Provisional Application No. 62/472,877, filed Mar. 17, 2017, entitled "MULTI-METAL CONTACT STRUCTURE," which is hereby incorporated by reference in its entirety.

FIELD

The following description relates to processing of integrated circuits ("ICs"). More particularly, the following description relates to devices and techniques for processing substrates.

BACKGROUND

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic or memory storage operations. These wiring structures or interconnect structures are essentially a skeletal network of conducting materials, typically metals, in a matrix of dielectric materials. In high performance devices and to improve device density and yield, it may be desirable to minimize topographic features within the interconnect layers for any given device and across the entire substrate. One common method of forming these high performance interconnect layers is the damascene process.

Multiple types of damascene structures are known, however single and dual damascene processes are the most common. In single damascene, each metal or via layer is fabricated in a series of operations, while in dual damascene, a metal layer and a via layer may be fabricated in a similar operation. Of these two, the dual damascene technique may be preferred because of lower cost and higher device performance.

In the single damascene process, a suitable substrate with or without devices is coated with a suitable resist layer. The resist layer is imaged to define desirable patterns by lithographic methods on the substrate. Cavities are etched on the patterned substrates typically by reactive ion etching (RIE) methods. The etched cavities are cleaned to remove RIE residues. The patterned substrate is then coated with a suitable barrier/seed layer prior to overfilling the cavities with a suitable metal, typically copper, by electro-deposition from a superfilling plating bath chemistry.

The damascene process may be repeated to form multiple layers of interconnects, and the top surface of the substrate is polished. As a result of the discontinuity in the properties (difference in mechanical properties, polishing rates, etc.) of the metal and insulator, and their respective interactions with the polishing pad, polishing slurry, and other process parameters, the polishing produces erosion in high metal pattern density features and dishing in large metal structures. The higher the metal pattern density, the higher the erosion in the dielectric layer. Similarly, the larger the size of the metal cavity, the worse the gravity of the dishing defect. These deleterious defects can cause a variety of defects in subsequent layers, reducing device yield.

Similar results are observed in cross section topographic profiles of polished through silicon via (TSV) structures. The centers of the vias are typically lower than the surface of the insulators.

Among the consequences of dishing on the interconnect structures is poor flatness of the conductor and much higher temperatures typically needed to bond devices to the dished substrate or for wafer to wafer bonding using so called hybrid bonding, i.e. DBI® techniques. With very large pads, dishing can be too deep for the opposing device's surfaces to mate intimately and to form a grain contact or inter-diffusion bond, as the metal may not expand enough at annealing temperatures to form the diffusion bond. Also, the poor flatness on the conductor surface often produces defective bonds, when the surface is bonded or attached to other devices or substrates.

Attempts to reduce the impact of these defects have included the incorporation of dummy dielectric features within large copper structures in dual damascene features for chip interconnects. This can effectively reduce the dishing in copper pads, since the metal width is significantly reduced as compared to previous large pads without dummy dielectric features within them. This approach has been helpful, but it has also increased mask design complexity and the associated loss of freedom of structure placement on the modified pads.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Various embodiments of techniques and devices for improving the conductivity of contact pads and associated devices, are disclosed. The embodiments comprise techniques to remedy the erosion or "dishing" of contact pads on substrates resulting from chemical mechanical polishing/planarizing (CMP) of the substrates, as well as improving the conductivity of the remedied contact pads on the substrates.

A microelectronic component can include a substrate including a recess or opening extending from a first surface of the substrate, at least a portion of the first surface of the substrate having a planarized topography. A first conductive material, having a first hardness, may be disposed within the recess or opening in a first preselected pattern and may form a first portion of an interconnect structure of the microelectronic component, the first portion of the interconnect structure extending normal to a plane of the substrate. Additionally, a second conductive material, having a second hardness different from the first hardness, may be disposed within the recess or opening in a second preselected pattern and may form a second portion of the interconnect structure of the microelectronic component, the second portion of the interconnect structure extending normal to the plane of the substrate.

In a first embodiment, a layer of the first conductive material may be disposed over an exposed surface of the second portion of the interconnect structure. Additionally, a layer of a third conductive material, different from the first and second conductive materials, may be disposed over an exposed surface of the first and second portions of the interconnect structure. Further, the first conductive material may comprise copper or a copper alloy and the second conductive material may comprise nickel or a nickel alloy. Still yet, the first conductive material or the second conductive material may comprise at least one of copper, nickel, tin, indium, gallium, or gold, or an alloy of at least one of copper, nickel, tin, indium, gallium, or gold.

In a second embodiment, a conductive layer may be disposed at a preselected depth below the first surface of the substrate and extending parallel to the plane of the substrate, the first portion of the interconnect structure and the second portion of the interconnect structure formed on a first surface of the conductive layer. Further, one or more additional conductive materials having one or more additional hardness characteristics different from the first hardness and the second hardness, may be disposed within the recess or opening in one or more preselected patterns and forming one or more additional portions of the interconnect structure of the microelectronic component. Still yet, the first portion of the interconnect structure and the second portion of the interconnect structure may be adjacent vertical layers, extending normal to the plane of the substrate.

In a third embodiment, the second hardness of the second conductive material may be greater than the first hardness of the first conductive material.

In a fourth embodiment, an exposed surface of the second portion of the interconnect structure may protrude above an exposed surface of the first portion of the interconnect structure and may be level with or recessed below the first surface of the substrate.

In a fifth embodiment, a coefficient of thermal expansion (CTE) of the first conductive material may be greater than a CTE of the second conductive material.

In a sixth embodiment, the first preselected pattern may comprise a grid pattern and the second preselected pattern may comprise a fill between portions of the grid pattern. Additionally, the first preselected pattern and the second preselected patterns may comprise alternating concentric rings. Further, the second preselected pattern may comprise a first elliptical or polygonal shape and the first preselected pattern may comprise a plurality of smaller elliptical or polygonal shapes, the plurality of smaller elliptical or polygonal shapes arranged within a perimeter of the first elliptical or polygonal shape.

A microelectronic component can include a substrate including a recess or opening extending from a first surface of the substrate, at least a portion of the first surface of the substrate having a planarized topography. A first material, having a first hardness, may be disposed within the recess or opening in a grid pattern and may form a first portion of an interconnect structure of the microelectronic component, the first portion of the interconnect structure extending normal to a plane of the substrate. Additionally, a second material, having a second hardness different from the first hardness, may be disposed within the recess or opening in a pattern comprising a fill between portions of the grid pattern and may form a second portion of the interconnect structure of the microelectronic component, the second portion of the interconnect structure extending normal to the plane of the substrate, wherein one of the first and second materials may comprise a conductive material and the other of the first and second materials comprises a non-conductive material or dielectric.

A microelectronic component can include a substrate including a recess or opening extending from a first surface of the substrate, at least a portion of the first surface of the substrate having a planarized topography. A first material, having a first hardness, may be disposed within the recess or opening in a first pattern and may form a first portion of an interconnect structure of the microelectronic component, the first portion of the interconnect structure extending normal to a plane of the substrate. Additionally, a second material, having a second hardness different from the first hardness, may be disposed within the recess or opening in a second pattern and may form a second portion of the interconnect structure of the microelectronic component, the second portion of the interconnect structure extending normal to the plane of the substrate, wherein one of the first and second materials may comprise a conductive material and the other of the first and second materials may comprise a non-conductive material or dielectric and wherein the first and second patterns may comprise alternating concentric rings.

A method of forming a microelectronic component can include forming a recessed portion in a first surface of a substrate, the recessed portion extending a preselected depth below the first surface of the substrate. A first conductive material may be disposed having a first hardness within the recessed portion in a first preselected pattern to form a first portion of an interconnect structure of the microelectronic component, the first portion of the interconnect structure extending normal to a plane of the substrate. Additionally, a second conductive material may be disposed having a second hardness different than the first hardness within the recessed portion in a second preselected pattern to form a second portion of the interconnect structure of the microelectronic component, the second portion of the interconnect structure extending normal to the plane of the substrate. Further, the first surface of the substrate may be planarized for intimate surface bonding, the planarizing forming an exposed surface of the first portion of the interconnect structure recessed below the first surface of the substrate and may form an exposed surface of the second portion of the interconnect structure protruding above the exposed surface of the first portion of the interconnect structure and level with or recessed below the first surface of the substrate.

In a seventh embodiment, a layer of the first conductive material may be deposited over the exposed surface of the second portion of the interconnect structure. Additionally, the first interconnect structure and the second interconnect structure comprise one of an electrical contact pad or a via in pad. Further, the first portion of the interconnect structure or the second portion of the interconnect structure may be formed of a reflowable metal material. The first portion of the interconnect structure and the second portion of the interconnect structure may additionally be formed as adjacent vertical layers, extending normal to the plane of the substrate.

In an eighth embodiment, the microelectronic component may be a first microelectronic component and the interconnect structure may be a first interconnect structure, and a surface of a second microelectronic component may be contacted to the first surface of the first microelectronic component to bond the second microelectronic component to the first microelectronic component without an adhesive layer, and a second interconnect structure of the second microelectronic component may be bonded to the first interconnect structure by a metal to metal diffusion bond without an intervening reflowable material.

In a ninth embodiment, a conductive layer may be formed within the recessed portion of the substrate at the preselected depth below the first surface of the substrate and extending parallel to the plane of the substrate, and the first portion of the interconnect structure and the second portion of the interconnect structure may be formed on a first surface of the conductive layer.

A microelectronic component can include a substrate including a recess or opening extending from a first surface of the substrate, at least a portion of the first surface of the substrate having a planarized topography. A first conductive material, having a first melting point, may be disposed within the recess or opening in a first preselected pattern and may form a first portion of an interconnect structure of the microelectronic component, the first portion of the interconnect structure extending normal to a plane of the substrate. Additionally, a second conductive material, having a second melting point greater than the first melting point, may be disposed within the recess or opening in a second preselected pattern and may form a second portion of the interconnect structure of the microelectronic component, the second portion of the interconnect structure extending normal to the plane of the substrate and may have an exposed surface of the second portion of the interconnect structure protruding above the exposed surface of the first portion of the interconnect structure and level with or recessed below the first surface of the substrate.

In a tenth embodiment, one or more additional conductive materials having one or more additional and different melting points may be disposed within the recess or opening in one or more preselected patterns and forming one or more additional portions of the interconnect structure of the microelectronic component.

A microelectronic component can include a substrate including a recess or opening extending from a first surface of the substrate, at least a portion of the first surface of the substrate having a planarized topography. A first conductive material, having a first melting point, may be disposed within the recess or opening at a conducting layer of the substrate and may form a first portion of an interconnect structure of the microelectronic component, the first portion of the interconnect structure extending normal to a plane of the substrate and having a thickness greater than one micrometer. Additionally, a second conductive material having a second melting point different than the first melting point, may be disposed within the recess or opening at the conducting layer of the substrate and may form a second portion of the interconnect structure of the microelectronic component, the second portion of the interconnect structure extending normal to the plane of the substrate and having a thickness greater than one micrometer.

A microelectronic component can include a substrate including a recess or opening extending from a first surface of the substrate, at least a portion of the first surface of the substrate having a planarized topography. A first conductive material, having a first hardness, may be disposed within the recess or opening in a first preselected pattern and may form a first portion of an interconnect structure of the microelectronic component, the first portion of the interconnect structure extending normal to a plane of the substrate. Additionally, a second non-conductive material, having a second hardness different from the first hardness, may be disposed within the recessed portion in a second preselected pattern and may form a second portion of the interconnect structure of the microelectronic component, the second portion of the interconnect structure extending normal to the plane of the substrate. Further, the second preselected pattern may comprise a first elliptical or polygonal shape and the first preselected pattern may comprise a plurality of smaller elliptical or polygonal shapes, the plurality of smaller elliptical or polygonal shapes arranged within a perimeter of the first elliptical or polygonal shape.

The disclosed processes can be implemented in any suitable manufacturing or processing apparatus or system, along with any hardware, software, firmware, or a combination thereof, without departing from the scope of the subject matter described herein. Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of techniques and devices for improving the conductivity of contact pads and associated devices, are disclosed. The embodiments comprise techniques to remedy the erosion or "dishing" of contact pads on substrates resulting from chemical mechanical polishing/planarizing (CMP) of the substrates, as well as improving the conductivity of the remedied contact pads on the substrates.

Figure 1A:
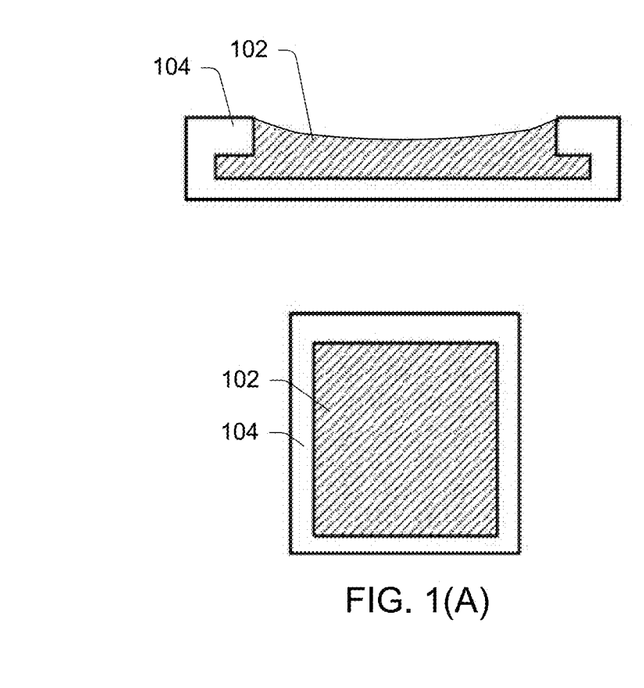
FIG. 1(A) shows a profile view and a plan view of dishing of a large contact pad as a result of example substrate processing.

FIG. 1(A) shows a profile view and a plan view of dishing of a large contact pad as a result of example substrate processing. As shown, a cross-section of a large metallic (copper, for example) contact pad 102 is disposed within a substrate 104 (which may comprise a dielectric or other insulating or semiconductor layer, for example), as part of a microelectronic device, for instance. The contact pad 102 shows significant dishing as a result of processing the substrate 104, such as CMP polishing, for example. In one example, a contact pad 102 could be as large as 10 to 60 micro meters wide (diameter if a circular pad or side if a square pad; other shapes may also be possible). The substrate 104 may include wafers, such as GaAs, diamond coated substrates, silicon carbide, silicon oxide, Silicon Nitride, silicon wafers, Lithium Niobate, Lithium Tantalate, flat panels, glasses, ceramics, circuit boards, packages, an interposer, structures with or without an embedded device or devices, etc. For clarity, the substrate 104 comprises a surface of interest processed for intimate contact with another surface.

As shown in FIG. 1(A), as a result of chemical mechanical planarization (CMP), or the like, the contact pad 102 (which may be metallic) may be generally dished or recessed with respect to the substrate 104, due to the mechanical, chemical, or physical properties of the conductive metal of the contact pad 102 being different from those of the surrounding substrate 104 (which may be silicon oxide, diamond, silicon nitride or silicon oxynitide or alumina for example). In some cases, the dishing effect can be greater when the polishing compound includes metals and/or various chemicals that can remove the metal of the contact pad 102 faster than the substrate 104. Additionally, in one embodiment, the size of the recess or dishing effect may be directly proportional to the polishing pressure (i.e. the higher the pressure, the greater recess) and/or the lateral dimensions of the contact pad. In some cases, the depth of the recess in the contact pad 102 may range between 10-150 nm or up to 1-2 microns, or more. This is well beyond the range that may be generally desirable for direct bond interconnects (DBI) and other bonding methods that use intimate surface contact, especially where the interconnect features are thinner than 1 micron.

Figure 1B:
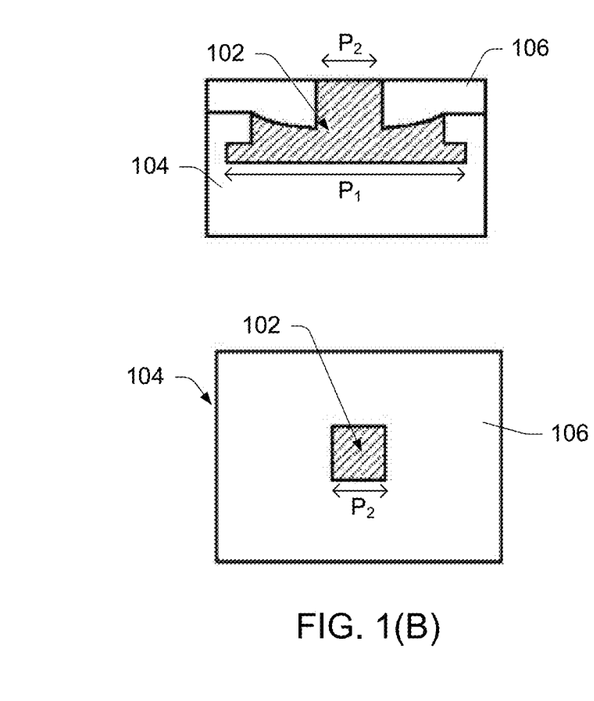
FIG. 1(B) shows a profile view and a plan view of a polished plated substrate with added conforming dielectric layer(s) used to reduce dishing of the contact area.

As shown in FIG. 1(B), one technique to attempt to resolve problems generated by the excessive dishing shown at FIG. 1(A) includes forming an added dielectric layer 106 (which may comprise one or more dielectric (or other material) layers) over the substrate 104 and some or all of the contact pad 102. When the dielectric layer 106 is planarized (using known methods, for example), the resulting exposed portion of the contact pad 102 can have a lateral dimension $P_2$ that is smaller than a lateral dimension $P_1$ of the contact pad 102 beneath.

The smaller lateral dimension $P_2$ of the exposed portion of the contact pad 102 can result in a more acceptable recess profile for direct bonding applications. For example, the smaller exposed contact pad 102 may result in reduced dishing during the CMP process, and the planarized surface of the added dielectric 106 comprises the new bonding surface.

This approach can be helpful to reduce dishing, but it can also increase mask design complexity and the associated loss of freedom of structure placement on the modified contact pads. Further, the exposed area of the modified contact pad (indicated by $P_2$) is a fraction of the area of the original pad (indicated by $P_1$), greatly reducing the electrical contact area and increasing the resistance of the contact area of the pad 102. The smaller contact pad 102 reduces the electrical current carrying capacity of the contact pad 102, which is not always desirable.

Figure 2A:
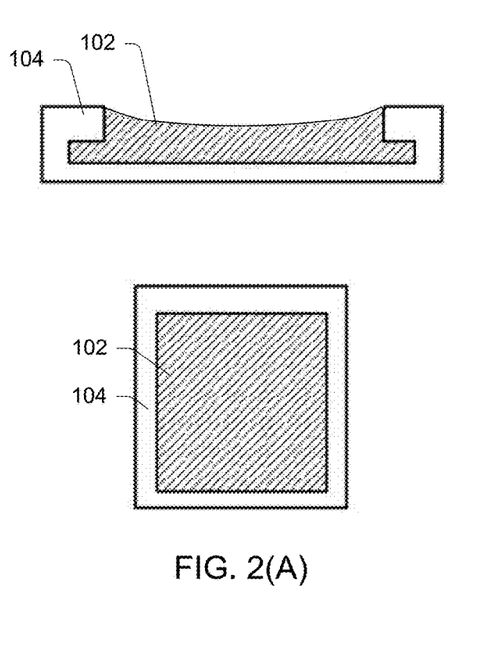
FIG. 2(A) shows a profile view and a plan view of dishing of a large contact pad as a result of example substrate processing.

FIG. 2(A) shows a profile view and a plan view dishing of a large contact pad as a result of example substrate processing. As shown, a large contact pad 102 (which may be metallic) is disposed within a substrate 104 (which may be a dielectric), as described with reference to FIG. 1(A). As described above, the contact pad 102 shows significant dishing as a result of processing the substrate 104, such as CMP polishing, for example.

Figure 2B:
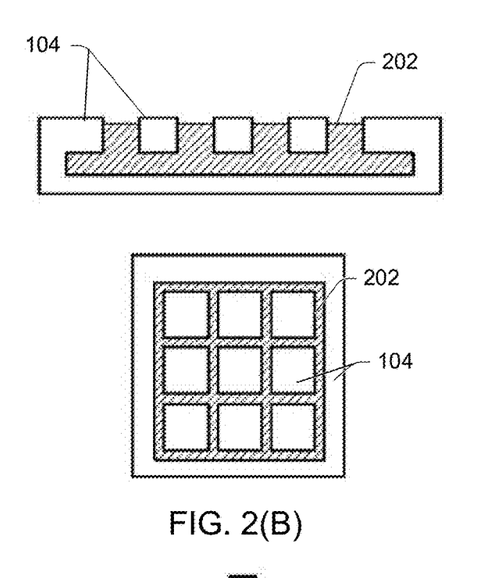
FIG. 2(B) shows a profile view and a plan view of a substrate with an embedded metallic grid used to reduce dishing of a contact area.

FIG. 2(B) illustrates another remedy sometimes used to minimize dishing of the contact area. As shown at FIG. 2(B), to avoid severe dishing, the metal-to-oxide density can be reduced at the contact area using a metallic grid 202. For example, the metallic grid 202 can have a similar area dimension as the large contact pad 102, and can be used in place of the contact pad 102. The metallic grid 202 can comprise a copper mesh, for example, the perimeter of which approximates the perimeter of the contact pad 102. The metallic grid 202 can be continuous with or coupled to other interconnect structures, wiring features, vias, or the like, to provide electrical connectivity for a microelectronic device, or the like.

The metallic grid 202 may be formed, for example, by etching trenches in the substrate 104, and filling the trenches (using deposition, a damascene process, or the like) with copper or other conductive materials. Since the traces of the metallic grid 202 can have a minimal width (e.g., 1-10 um, for example), the dishing of the contact area can be greatly reduced (down to about 2-10 nm, for instance). This process may result in a more even bonding surface, which is advantageous for bonding using intimate surface contact techniques.

However, the metallic grid 202 can significantly reduce the electrical contact area and increase the resistance of the contact area. For example, while the overall area within the contact pad may be approximately 25 um×25 um (625 um$^2$), the effective area of the grid available for contact may be much smaller, on the order of 184 um$^2$ (8×[1um×25 um]−16 um$^2$) for the trench thickness of 1 um and the effective contact area when 2 such pads are bonded together using a DBI method may be even smaller, on the order of 18 um$^2$ or lower, due to the offset between the contact pads. The reduction in electrical contact, the effective increase in contact resistance and resulting loss of performance of the contact area can make this a less than ideal solution.

Figure 2C:
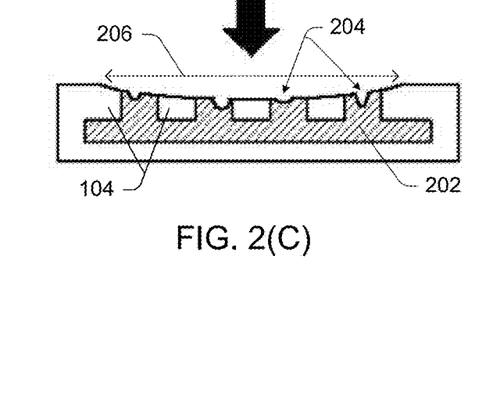
FIG. 2(C) shows a profile view of dishing of substrate with an embedded metallic grid.

Also, the substrate 104 (which may be a silicon oxide region, a dielectric material, or the like) between adjacent metallic traces within the grid 202 can experience erosion. The erosion of the substrate 104 may even be more severe than the dishing of the metallic grid 202 in some instances. For example, the erosion of the substrate 104 may range between 10 to 25 nm or even greater, while the dishing in the metallic grid 202 may still be within specification. In such instances, the large erosion of the substrate 104 now controls the higher bonding temperature used for the metallic grid 202 to expand to contact the opposing mating device. Further, excessive substrate 104 erosion can produce voids in portions of the structures, where the opposing surfaces cannot mate intimately. FIG. 2(C) shows a profile view of dishing of substrate 104 with an embedded metallic grid 202. As shown at FIG. 2(C), after polishing the substrate 104 and the metallic grid 202, dishing 204 and dielectric erosion 206 may result.

Example Embodiments

Figure 3A:
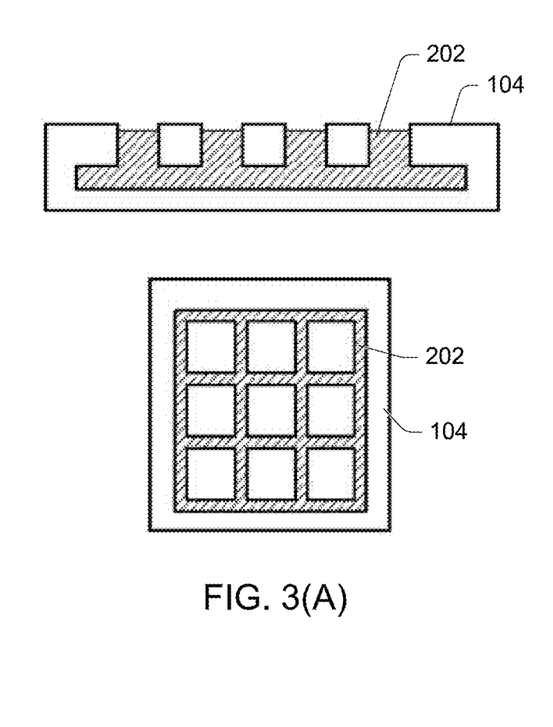
FIG. 3(A) shows a profile view and a plan view of the substrate with embedded metallic grid of FIG. 2(B).
Figure 3B:
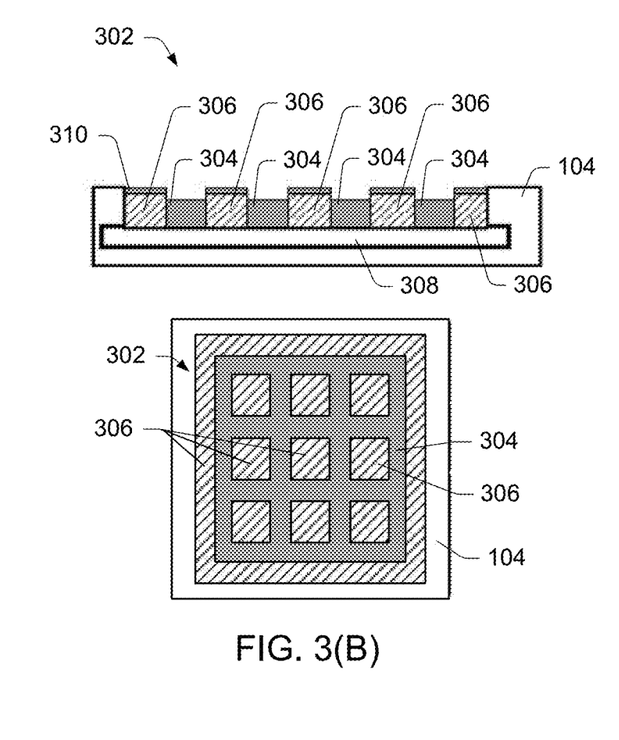
FIG. 3(B) shows a profile view and a plan view of a substrate with an example multi-metal contact area, according to an embodiment.

FIG. 3 shows a comparison of the metallic grid 202 (shown at FIG. 3(A) in cross-section and plan views) with a novel multi-metal contact structure 302, according to one embodiment. In various embodiments, the multi-metal structure 302 (shown at FIG. 3(B), also in cross-section and plan views) can be used in place of the metallic grid 202 or the contact pad 102 to reduce dishing of the contact area, without the issue of erosion of the substrate 104 between the traces of the grid 202. For instance, as shown in FIG. 3(B), the multi-metal contact structure 302 can be comprised of two or more conductive materials, such as metals for example. A first conductive material can be used to form the mesh 304, similar to the metallic grid 202. For example, the first conductive material may comprise copper, a copper alloy, or the like. The first conductive material may be softer than the surrounding substrate, and so may be susceptible to some dishing during polishing. Accordingly, the width of the mesh 304 traces can be kept to a minimum (1-5 um, for example) to reduce dishing, but may be greater than the metallic grid 202 in some cases.

Instead of a dielectric fill between portions of the mesh, the areas between portions of the mesh 304 of the multi-metal structure 302 can be filled with a second conductive material. The second conductive material of the fill 306 can be harder than the first conductive material of the mesh 304, to reduce the dishing of the contact area. For example, the second conductive material may comprise nickel, a nickel alloy, or the like. In various implementations, different pairs of metals (such as copper and tin, for example) can be used to form the mesh 304 and fill 306, where the softer of the metals may be used for the mesh 304. Alternately, a third conductive material (or more) can be used to form part of the mesh 304 and/or portions of the fill 306, as desired for hardness, conductivity, coefficient of thermal expansion (CTE), and the like. In another case, the second conductive material of the fill 306 can be softer (e.g. Cu) than the first conductive material of the mesh 304 (e.g. Ni). This can also reduce the dishing of the contact area.

The fill 306 may be formed by removing one or more portions of the substrate 104 (which may be oxide) surrounding and/or between the portions of the mesh 304. The second conductive material may be deposited in the vacated areas where the oxide was removed. In alternate embodiments, not all of the oxide surrounding and/or in between the mesh 304 may be removed, and the fill 306 may be formed with other patterns than those illustrated. In other words, in alternate embodiments, the fill 306 may comprise portions of one or more conductive materials and portions of dielectric.

The use of multiple conductive materials (metals, for example) to form the multi-metal structure 302 increases the overall performance of the contact area, by increasing the electrically conductive area of contact and reducing the resistance. Dishing may also be reduced with the multi-metal structure 302 (to about 2-10 nm) as compared to the large conductive contact pad 102 (>10-60 nm). One of the conductive materials can be selected to have a lower CTE, as compared to the CTE of the other conductive material, to allow the first conductive material to expand more under thermal conditions during bonding.

As discussed further below, the multi-metal structure 302 may be formed on a conductive layer 308, which may be coupled to or continuous with other interconnect structures, wiring features, vias, or the like, to provide electrical connectivity for a microelectronic device, or the like, having the multi-metal structure 302. To enhance bonding of the multi-metal structure 302 to another contact area, the fill 306 comprising the second conductive material (or another conductive material) can be flashed (as shown at 310) with the first conductive material (copper, for instance), or the like. This allows the diffusion bonding based on a lower annealing temperature for the first conductive material to be operative on both portions of the multi-metal structure 302.

Figure 4A:
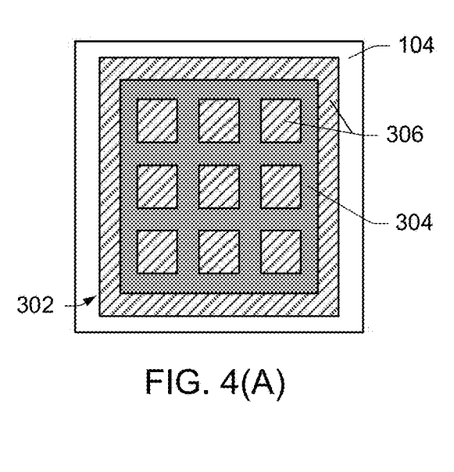
FIG. 4(A) shows a plan view of a substrate with an example multi-metal contact area according to a first embodiment.
Figure 4B:
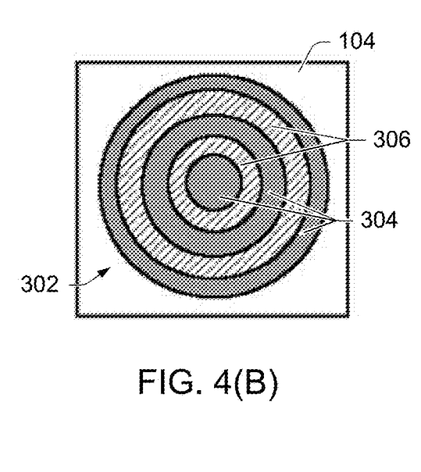
FIG. 4(B) shows a plan view of a substrate with an example multi-metal contact area according to a second embodiment.
Figure 4C:
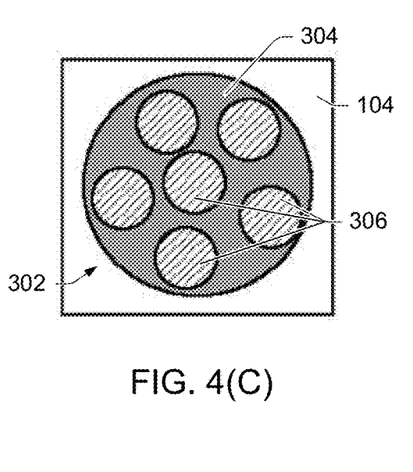
FIG. 4(C) shows a plan view of a substrate with an example multi-metal contact area according to a third embodiment.

Three example embodiments of a multi-metal structure 302 are illustrated at FIG. 4. The example embodiments include two or more different conductive materials to reduce dishing and improve conductivity of the contact area. In alternate embodiments, a multi-metal structure 302 can have various other shapes, patterns, quantities of different materials, and so forth, and remain within the scope of the disclosure.

The multi-metal structure 302 at FIG. 4(A) represents a first embodiment having the rectangular grid pattern as discussed above, with reference to FIG. 3(B). At FIG. 4(B), a second embodiment is illustrated with an overall elliptical shape. The multi-metal structure 302 includes alternating rings of alternating conductive materials, representing the mesh 304 and fill 306 portions. The negative effects of sharp corners on the multi-metal structure 302 may be avoided using an elliptical cross-sectional shape. The positive aspects of reduced dishing and improved conductivity due to increased conductive contact area may be present with the embodiment in addition to the reduction in adverse effects on electrical performance due to elimination of sharp corners. In some embodiments (not shown), a mesh 304 (and associated fill 306) with polygonal patterns or other patterns can be formed within the overall elliptical shape of FIG. 4(B).

At FIG. 4(C), a third embodiment is illustrated with an overall elliptical shape as well, with the stated advantages. The multi-metal structure 302 includes mesh 304 of the first conductive material within the surrounding fill 306. In various implementations, the mesh 304 may have an elliptical shape (as shown) or they may have polygonal or other shapes and/or sizes. This embodiment also provides reduced dishing and improved conductivity due to the increased conductive contact area of the multi-metal structure 302. The depth of dishing may be altered by changing the area of one or more of the mesh 304. Of course, it is to be appreciated that mesh 304 and surrounding fill 306 may be of any formation, size, and/or shape.

Figure 5:
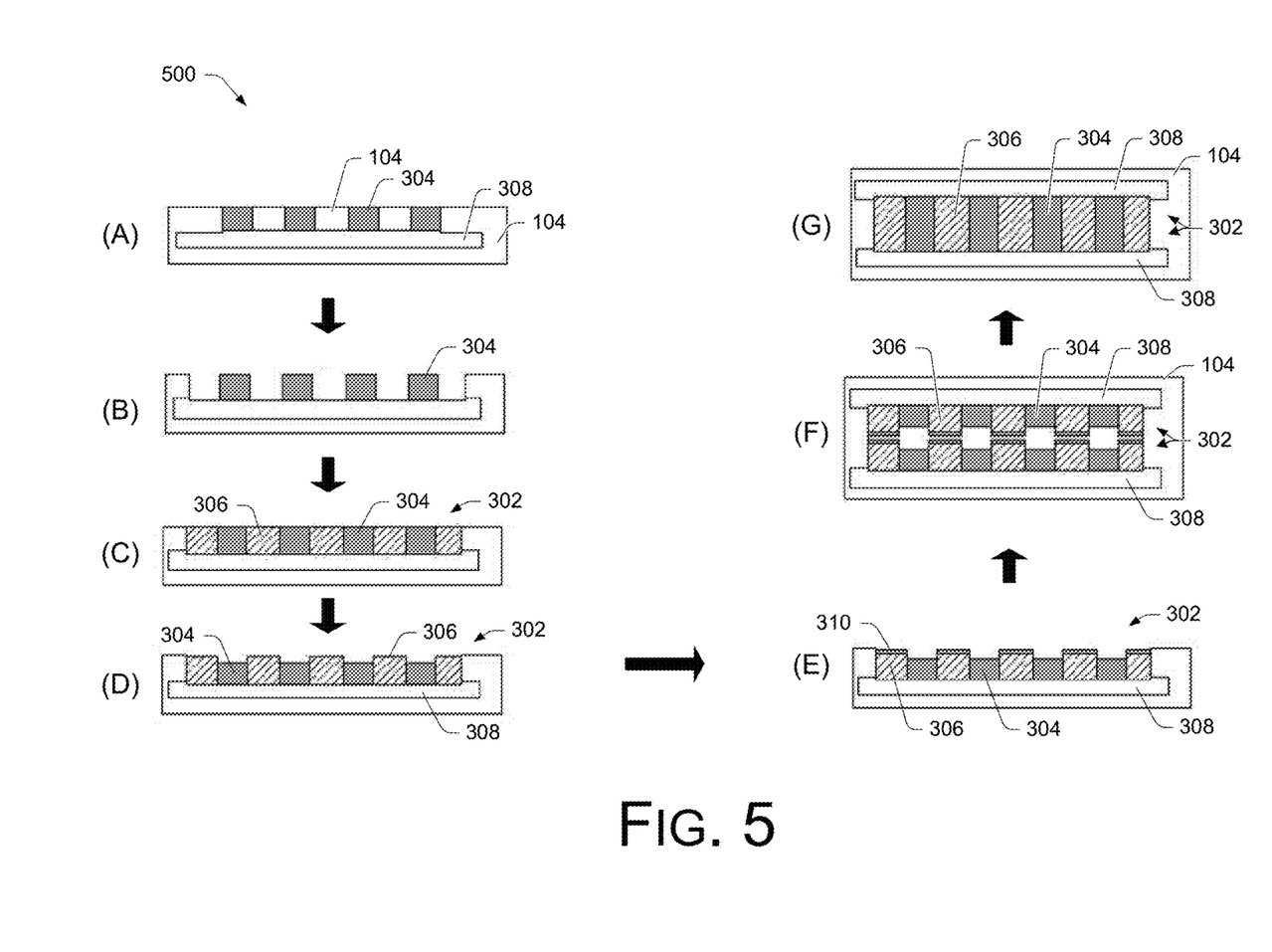
FIG. 5 illustrates an example process of forming and bonding two substrates with multi-metal contact areas, according to an embodiment.

FIG. 5 illustrates an example process 500 of forming a contact area of the multi-metal structure 302, and bonding two substrates with contact areas comprising the multi-metal structure 302, according to an embodiment. At (A), a first conductive material (copper, for example) may be formed in a desired pattern (such as a mesh 304, for example) on a surface of the substrate 104. The pattern of the first conductive material may be formed by removing a portion of the substrate 104 (by etching, for example), and depositing the first conductive material in the vacancies created (via a damascene process, or other deposition). If the substrate 104 comprises silicon oxide, for example, adhesion layers comprising titanium, tantalum, chromium, or the like, may be deposited before depositing the first conductive material. The first conductive material may be conductively coupled to the conductive layer 308, which may comprise copper, aluminum, or the like, and may be continuous with other contact areas of the device. In one embodiment, nickel, a nickel alloy, or other conductive material may be used in place of copper as the first conductive material.

At (B), remaining portions of the substrate 104 surface around the conductive pattern (e.g., mesh 304) may be removed. Alternately, some of the dielectric material of the substrate 104 surface may be allowed to remain, to form a desired pattern. At (C), the second conductive material (nickel, for example) may be deposited in the vacancies of the substrate 104 surface, forming the fill 306. Alternately, a third (or more) conductive material may be deposited to form the mesh 304 or the fill 306. The combination of the mesh 304 and the fill 306 forms the multi-metal structure 302, which includes an electrical contact structure comprising a pattern of vertical layers of two or more conductive materials, extending normal to the plane of the substrate 104, as shown.

At (D), the surface of the device (substrate 104 and multi-metal structure 302) may be polished, using a CMP process, or the like. As a result of the polishing, some dishing may occur on the exposed surface of the conductive materials (minimal dishing, 2-10 nm, due to the pattern of the multi-metal structure 302), with a greater dishing occurring on the mesh 304 than the fill 306, due to the difference in hardness of the materials.

At (E), a flash 310 (via electro-less plating, for example) of the first conductive material (e.g., copper) may be applied to the exposed surface of the fill 306 areas to facilitate bonding. For instance, the flashed metal allows the fill 306 areas to bond at the same annealing temperature as the mesh 304 areas. At (F), the device may be bonded to another device using a ZIBOND® technique, or the like, wherein the dielectric portions of the substrate 104 are bonded to dielectric portions of the other device. In an example, as shown in FIG. 5, the other device may be a device with a multi-metal structure 302.

At (G), the multi-metal structure 302 may be bonded to the other multi-metal structure 302, using annealing, or the like, such as a direct bond interconnect (DBI) technique, i.e. directly bonding or diffusion bonding the surfaces of the multi-metal structures 302 without an intervening reflowable material, such as solder. For example, the DBI technique may use predetermined heat to bond the multi-metal structures 302. During annealing, the copper flashing on the fill 306 allows the second conductive material (e.g., nickel) to bond at the same temperature as the first conductive material (e.g., copper). The coefficient of thermal expansion (CTE) of the nickel (for example) of the fill 306 may be less than the CTE of the copper (or tin, for instance) of the mesh 304, allowing the copper to expand more than the nickel, and to fill the gaps in the metal to metal bond. In some embodiments the flash layer 310 coated over the multi-metal structure 302 may be comprised of tin, indium, gallium, gold, or the like, or their respective alloys and combinations thereof. In some applications, the melting point of the flash layer 310 may be similar or lower than the melting point of the first or second conductive materials of the mesh 304 or fill 306 respectively. In some applications, a reflowable metal like tin may also be used as mesh 304 or fill 306.

Figure 6:
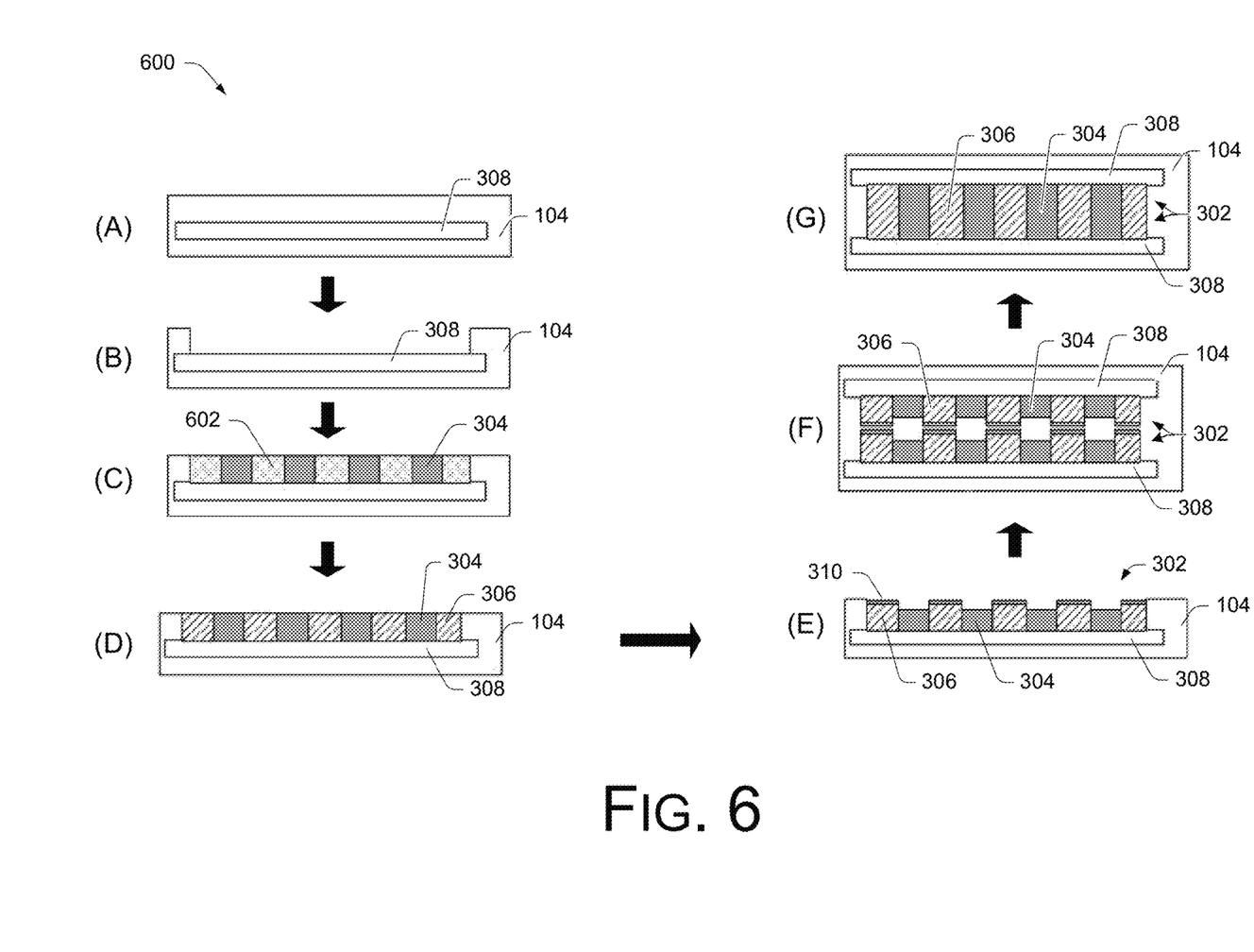
FIG. 6 illustrates another example process of forming and bonding two substrates with multi-metal contact areas, according to an embodiment.

FIG. 6 illustrates another example process 600 of forming a contact area of the multi-metal structure 302, and bonding two substrates with contact areas of the multi-metal structure 302, according to an embodiment. At (A), a conductive layer 308 may be formed within a dielectric (or the like) substrate 104. At (B), a portion of the oxide substrate may be removed to reveal the conductive layer 308. At (C), resist 602 may be applied to the conductive layer 308, developed and patterned. The first conductive metal (e.g., copper) may be deposited in cavities formed by the resist 602, the cavities forming a preselected pattern (such as mesh 304, for example) on a surface of the conductive layer 308. The first conductive material may be conductively coupled to the conductive layer 308, which may comprise copper, aluminum, or the like, and may be continuous with other contact areas of the device. The mesh 304 extends from the conductive layer 308 normal to the plane of the substrate 104.

At (D), the process includes removing the resist 602, and depositing the second conductive material. The second conductive material (nickel, for example) may be deposited in the vacancies of the removed resist 602, forming the fill 306. This may be followed by polishing (by CMP, for example) which can result in some minimal dishing of the first and second conductive materials. Alternately, a third (or more) conductive material may be deposited to form the mesh 304 or the fill 306. The combination of the mesh 304 and the fill 306 forms the multi-metal structure 302, which includes an electrical contact area comprising a pattern of vertical layers of two or more conductive materials, extending normal to the plane of the substrate 104, as shown. Still in other embodiments, after forming the conductive layer 304 by thru-mask plating methods, the resist layer 602 may be stripped to expose the top surface of conductive layer 308; a new patterned resist (not shown) may be formed over the conductive layer 308 to selectively form the second conductor fill 306. The second resist may be stripped and a planarizing or non-planarizing layer may be coated over the plated structures mesh 304 and fill 306 prior to a CMP operation.

At (E), CMP may be performed on the multi-metal structure 302 and a flash 310 (via electro-less plating, for example) of the first conductive material (e.g., copper) may be applied to the exposed surface of the fill 306 areas to facilitate bonding. For instance, the flashed metal allows the fill 306 areas to bond at the same annealing temperature as the mesh 304 areas. At (F), the device may be bonded to another device using a ZIBOND® technique, or the like, wherein the dielectric portions of the substrate 104 are bonded to dielectric portions of the other device. In an example, as shown in FIG. 6F, the other device may be a device with a multi-metal structure 302.

At (G), the multi-metal structure 302 may be bonded to the other multi-metal structure 302, using annealing, or the like, such as a direct bond interconnect (DBI) technique, i.e. directly bonding the surfaces of the multi-metal structures 302 without an intervening reflowable material, such as solder. For example, the DBI technique may use pressure and/or heat to bond the multi-metal structures 302. During annealing, the copper flashing 310 on the fill 306 allows the second conductive material (e.g., nickel) to bond at the same temperature as the first conductive material (e.g., copper). The coefficient of thermal expansion (CTE) of the nickel of the fill 306 may be less than the CTE of the copper (or tin, for instance) of the mesh 304, allowing the copper to expand more than the nickel, and filling the gaps in the metal to metal bond. In some embodiments the flash layer 310 coated over the multi-metal structure 302 may be comprised of tin, indium, gallium, gold or their respective alloys and combinations thereof. In some applications, the melting point of the flash layer 310 may be similar or lower than the melting point of the first or second conductive materials of mesh 304 or fill 306 respectively. In some applications, a reflowable metal like tin may also be used as mesh 304 or fill 306.

Figure 7:
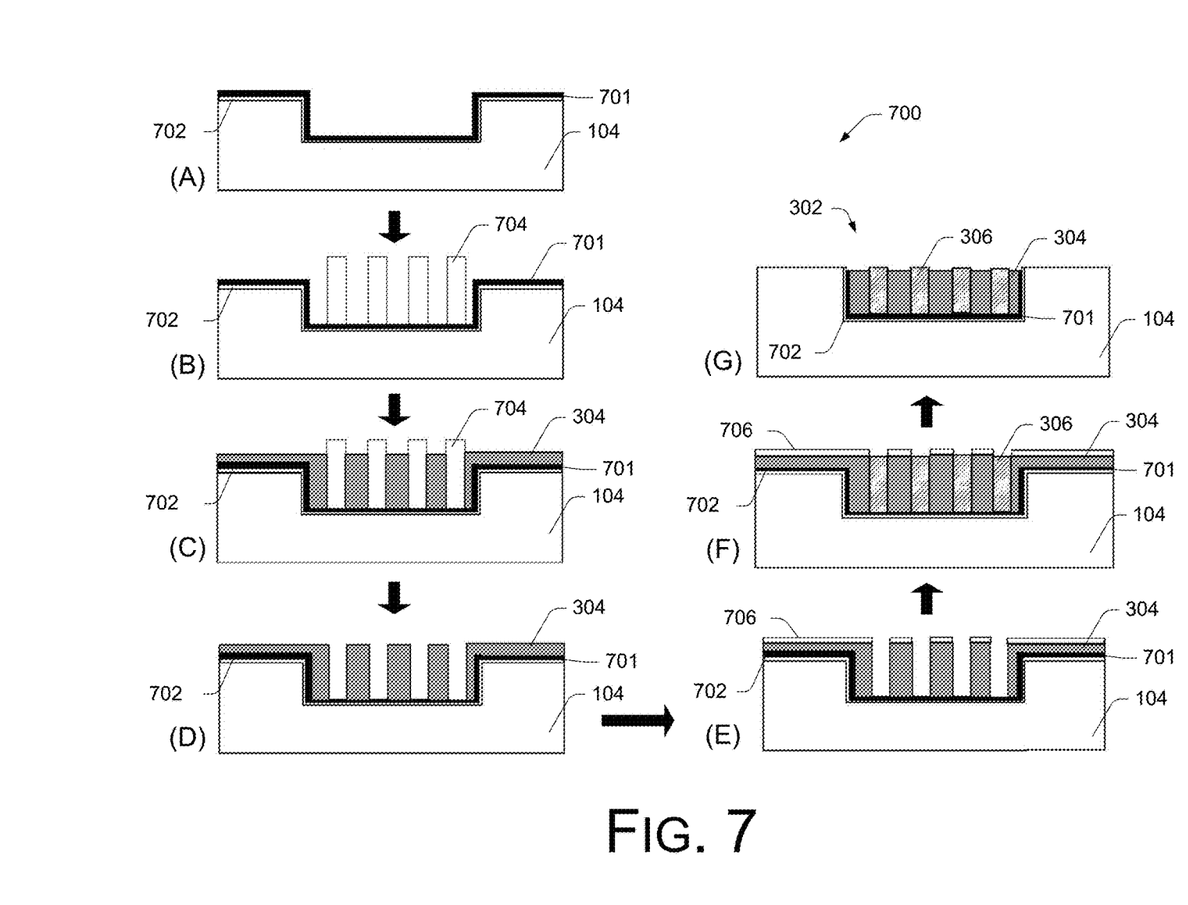
FIG. 7 illustrates another examples process of forming and bonding two substrates with multi-metal contact areas, according to an embodiment.

FIG. 7 illustrates another examples process 700 of forming and bonding two substrates 104 with multi-metal contact areas, according to an embodiment. In one embodiment, the process 700 may relate to forming a multi-metal contact structure 302, or the like. At (A), a barrier layer 702 may be applied over the substrate 104 comprising one or more cavities (such as damascene cavities). Additionally, a seed layer 701 may be applied on the surface of the barrier 702.

At (B), a first resist layer 704 (which may be patterned) may be formed over portions of the seed layer 701.

At (C), the mesh 304 (for example a conductive layer, such as copper) may be deposited over portions of the seed layer 701 not protected by the resist layer 704. In one embodiment, the mesh 304 may be deposited using thru-mask plating, electrolytic, electroless, or another known method. At (D), the first resist layer 704 may be removed from the surface of the seed layer 701.

At (E), a second resist layer 706 (which may be patterned) may be formed over mesh 304. At (F), fill 306 may be selectively formed on the exposed seed layer 701 and sidewalls of the mesh 304. At (G), the mesh 304 and fill 306 are planarized (for example, by using CMP methods).

In one embodiment, a planarized substrate 104 may be prepared and bonded to another substrate. Additionally, a layer (which may be very thin) of a third (or more) conductive material (for example, a metal such as copper, copper alloy, etc.) may be selectively coated over the mesh 304 and fill 306.

In one example, the third conductive material (not shown) may be the same material as the mesh 304. In another embodiment, the third conductive material may be dissimilar from the mesh 304 and the fill 306. For example, the third conductive material may comprise silver, tin, indium, gallium, and/or a combination of the foregoing materials. In one embodiment, a melting point of the third conductive material may be similar or lower than the melting point of the mesh 304 or fill 306. Additionally, the melting of the third conductive material may be lower than a melting point of one or more conductive materials beneath mesh 304 and/or fill 306.

In one embodiment, a multi-metal structure 302 may be bonded to another multi-metal structure 302 (or any number of multi metal structures 302), using annealing, or the like (such as a direct bond interconnect (DBI) technique). In this manner, the surfaces of the multi-metal structures 302 may be directly bonded without an intervening adhesive layer.

As an example, the DBI technique may use a predetermined heat to bond such multi-metal structures 302. During annealing, a third layer flashing (not shown) on the mesh 304 and/or fill 306 may allow for an additional conductive material (e.g., nickel) to bond at the same temperature as either of the mesh 304 or fill 306. In such an embodiment, the coefficient of thermal expansion (CTE) of nickel (for example of potentially fill 306) may be less than the CTE of the copper or tin (for example of potentially mesh 304), thereby allowing the copper to expand more than the nickel, and filling the gaps in the metal to metal bond. In some embodiments, the third conductive material may be distinguishable from the material used for the mesh 304 and/or fill 306 in the bonded structures or substrates.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

The invention claimed is:

1. A microelectronic component comprising one or more semiconductor devices, the microelectronic component comprising:
    a substrate including a recess or opening extending from a first surface of the substrate, at least a portion of the first surface of the substrate having a planarized topography;
    a first conductive material having a first hardness, disposed within the recess or opening in a first alternating pattern and forming a first portion of an interconnect structure of the microelectronic component, the first portion of the interconnect structure extending normal to a plane of the substrate;
    a second conductive material having a second hardness different from the first hardness, disposed within the recess or opening in a second alternating pattern that alternates with the first alternating pattern, and forming a second portion of the interconnect structure of the microelectronic component, the second portion of the interconnect structure extending normal to the plane of the substrate; and
    a conductive layer disposed at a preselected depth below the first surface of the substrate and extending parallel to the plane of the substrate, wherein the first portion of the interconnect structure and the second portion of the interconnect structure formed on a first surface of the conductive layer.

2. The microelectronic component of claim 1, further comprising a layer of the first conductive material disposed over an exposed surface of the second portion of the interconnect structure.

3. The microelectronic component of claim 1, further comprising a layer of a third conductive material, different from the first and second conductive materials, disposed over an exposed surface of the first and second portions of the interconnect structure.

4. The microelectronic component of claim 1, further comprising one or more additional conductive materials having one or more additional hardness characteristics different from the first hardness and the second hardness, disposed within the recess or opening in one or more preselected patterns and forming one or more additional portions of the interconnect structure of the microelectronic component.

5. The microelectronic component of claim 1, wherein the second hardness of the second conductive material is greater than the first hardness of the first conductive material.

6. The microelectronic component of claim 1, wherein an exposed surface of the second portion of the interconnect structure protrudes above an exposed surface of the first portion of the interconnect structure and is level with or recessed below the first surface of the substrate.

7. The microelectronic component of claim 1, wherein a coefficient of thermal expansion (CTE) of the first conductive material is greater than a CTE of the second conductive material.

8. The microelectronic component of claim 1, wherein the first conductive material comprises copper or a copper alloy and the second conductive material comprises nickel or a nickel alloy.

9. The microelectronic component of claim 1, wherein the first conductive material or the second conductive material comprises at least one of copper, nickel, tin, indium, gallium, or gold, or an alloy of at least one of copper, nickel, tin, indium, gallium, or gold.

10. The microelectronic component of claim 1, wherein the first alternating pattern comprises a grid pattern and the second alternating pattern comprises a fill between portions of the grid pattern.

11. The microelectronic component of claim 1, wherein the first portion of the interconnect structure and the second portion of the interconnect structure are adjacent vertical layers, extending normal to the plane of the substrate.

12. The microelectronic component of claim 11, wherein the adjacent vertical layers include an adhesion layer comprising at least one of titanium, tantalum, or chromium.

13. The microelectronic component of claim 1, wherein the microelectronic component is a first microelectronic component and the interconnect structure is a first interconnect structure, and further comprising a second microelectronic component, wherein a second interconnect structure of the second microelectronic component is bonded to the first interconnect structure by at least one of via an insulator material without adhesive to insulator material without adhesive bond or by a metal to metal diffusion bond, wherein the first interconnect structure and the second interconnect structure comprise one of an electrical contact pad or a via in pad.

14. A microelectronic component comprising one or more semiconductor devices, the microelectronic component comprising:
   a substrate including a recess or opening extending from a first surface of the substrate, at least a portion of the first surface of the substrate having a planarized topography;
   a first conductive material having a first hardness, disposed within the recess or opening in a grid pattern and forming a first portion of an interconnect structure of the microelectronic component, the first portion of the interconnect structure extending normal to a plane of the substrate;
   a second conductive material having a second hardness different from the first hardness, disposed within the recess or opening in a pattern comprising a fill between portions of the grid pattern and forming a second portion of the interconnect structure of the microelectronic component, the second portion of the interconnect structure extending normal to the plane of the substrate; and
   one or more additional conductive materials having one or more additional hardness characteristics different from the first hardness and the second hardness, disposed within the recess or opening and forming one or more additional portions of the interconnect structure of the microelectronic component.

15. A microelectronic assembly, comprising:
   a first microelectronic component comprising:
   a substrate including a recess or opening extending from a first surface of the substrate, at least a portion of the first surface of the substrate having a planarized topography;
   a first conductive material having a first hardness, disposed within the recess or opening in a grid pattern and forming a first portion of a first interconnect structure of the first microelectronic component, the first portion of the first interconnect structure extending normal to a plane of the substrate;
   a second conductive material having a second hardness different from the first hardness, disposed within the recess or opening in a pattern comprising a fill between portions of the grid pattern and forming a second portion of the first interconnect structure of the first microelectronic component, the second portion of the first interconnect structure extending normal to the plane of the substrate; and
   a second microelectronic component having a second interconnect structure bonded to the first interconnect structure by at least one of an insulator material without an adhesive to the insulator material, without an adhesive bond or by a metal to metal diffusion bond, wherein the first interconnect structure and the second interconnect structure comprise one of an electrical contact pad or a via in pad.

* * * * *